United States Patent
Leonov et al.

(10) Patent No.: US 10,679,432 B2
(45) Date of Patent: Jun. 9, 2020

(54) DIAGNOSTICS DEVICE TO DIAGNOSE A MOTORIZED DEVICE WITH AN ON-BOARD DIAGNOSTIC SYSTEM

(71) Applicant: Smart Vehicle Diagnostics, LLC., Lindenhurst, NY (US)

(72) Inventors: Alex Leonov, Lindenhurst, NY (US); Alan Hill, Lake Villa, IL (US)

(73) Assignee: MotoLink LLC, New York, NY (US)

( * ) Notice: Subject to any disclaimer, the term of this patent is extended or adjusted under 35 U.S.C. 154(b) by 8 days.

(21) Appl. No.: 15/941,573

(22) Filed: Mar. 30, 2018

(65) Prior Publication Data
US 2018/0286148 A1  Oct. 4, 2018

Related U.S. Application Data

(60) Provisional application No. 62/478,921, filed on Mar. 30, 2017.

(51) Int. Cl.
| | |
|---|---|
| G07C 5/00 | (2006.01) |
| H01R 13/50 | (2006.01) |
| H04W 88/02 | (2009.01) |
| G07C 5/08 | (2006.01) |
| H01R 13/627 | (2006.01) |
| H01R 13/22 | (2006.01) |
| H05K 7/14 | (2006.01) |

(52) U.S. Cl.
CPC ............. *G07C 5/008* (2013.01); *G07C 5/085* (2013.01); *H01R 13/50* (2013.01); *G07C 2205/02* (2013.01); *H01R 13/22* (2013.01); *H01R 13/6272* (2013.01); *H04W 88/02* (2013.01); *H05K 7/1427* (2013.01)

(58) Field of Classification Search
USPC ........................................ 701/31.5
See application file for complete search history.

(56) References Cited

U.S. PATENT DOCUMENTS

| | | | |
|---|---|---|---|
| 9,911,251 B2 | 3/2018 | Fountain | |
| 9,930,796 B2 | 3/2018 | Fantin et al. | |
| 2013/0274953 A1* | 10/2013 | Miljkovic | G01C 21/00 701/1 |
| 2014/0223531 A1* | 8/2014 | Outwater | H04L 63/0861 726/7 |
| 2015/0105971 A1* | 4/2015 | Naamani | H04W 4/80 701/33.2 |
| 2015/0228127 A1* | 8/2015 | Ross | G07C 5/008 701/31.4 |
| 2018/0286148 A1* | 10/2018 | Leonov | G07C 5/008 |

* cited by examiner

*Primary Examiner* — Tyler D Paige

(57) ABSTRACT

A diagnostic device to diagnose a motorized device with an on-board diagnostic system includes a housing, an electrical connector, and a wireless transmission element. The electrical connector is supported by the housing and is configured to connect to an electrical connector of the on-board diagnostic system. The wireless transmission element is electrically connected to the electrical connector and is supported by the housing.

18 Claims, 7 Drawing Sheets

DIAGNOSTICS DEVICE TO DIAGNOSE A MOTORIZED DEVICE WITH AN ON-BOARD DIAGNOSTIC SYSTEM

REFERENCE TO RELATED APPLICATIONS

This application is a continuation of U.S. provisional application No. 62/478,921, filed Mar. 30, 2017, entitled "Compact Vehicle OBD Diagnostics Adapter with Smartphone Connectivity".

BACKGROUND OF THE INVENTION

Field of the Invention

The present invention generally relates to diagnostic devices, and more specifically, to a compact, smartphone-connectable diagnostic device to diagnose a motorized device with an on-board diagnostics system.

Description of Related Art

The Environmental Protection Agency (EPA) requires that all cars and light trucks manufactured beyond the year 1996 have installed on-board diagnostics (OBD) systems, which include electronic sensors installed inside the vehicles that help monitor different components inside the vehicles. Sensor information is transmitted to an engine control unit (ECU) and a user is capable of troubleshooting a specific problem via dashboard lights or a portable diagnostic device (e.g., a diagnostic dongle) which can connect to the OBD system. The OBD systems for cars and trucks each have a diagnostic port, typically arranged under the operation panel and the steering wheel, to which the diagnostic device can connect to access from the ECU various vehicle information/data, such as error codes.

The on-board diagnostic port for cars and trucks is made according to the communication standard of OBD vehicle data standard (i.e. OBD-II in the USA, or E-OBD in Europe), which determines a shape/size of the diagnostic port's connector frame, a number and an arrangement of pins in the connector, and a communication protocol to be used to communicate with the ECU through the diagnostic port pins.

While only cars and light trucks are subject to this regulation, many other vehicles, such as, but not limited to, motorcycles, scooters, ATVs, snowmobiles, watercraft, etc. feature OBD systems as well. These OBD systems are different, however, from the OBD-II or E-OBD systems, and use different, often proprietary data standards, as well as different, and often proprietary diagnostic port connectors. OBD-II compatible diagnostic devices are not compatible with these other vehicles.

Existing diagnostic devices are relatively bulky, and vehicles such as many motorcycles, scooters, ATVs, snowmobiles, watercraft, etc. have very limited space for an off-board diagnostic device to connect to the OBD system. For example, a diagnostic port or connector of an OBD system on a motorcycle where a diagnostic device would plug into the OBD system is often beneath a side panel or under a seat, which must be removed or moved in order to access a small space where the diagnostic port is located. In these cases, a typical plug-in diagnostic device can be used with these vehicles only temporarily while the vehicle is stopped, because for instance, a side panel or the seat must be removed while using the diagnostic device.

Additionally, or alternatively, due to their bulkiness, conventional diagnostic devices, while connected to the OBD systems of these vehicles, obstruct users attempting to ride or drive the vehicles. Due to the limited space in these vehicles to accommodate a diagnostic device near the connector where the diagnostic device connects to the OBD system (relative to conventional diagnostic devices), some conventional diagnostic devices have positioned a main portion or housing of the diagnostic device outside the space around the OBD system connector, and extend, such as with a cable, from the main portion or housing to a connector that can plug into the mating connector of the OBD system. These diagnostic devices still are bulky and obstructive.

Further, diagnostic devices often lack a wireless transmission system, such that the diagnostic devices cannot connect to a mobile phone or similar device with wireless capability.

As a result of these drawbacks, conventional diagnostic devices do not enable users to collect live data during normal operation vehicles such as many motorcycles, scooters, ATVs, snowmobiles, watercraft, etc., and they do not enable constant or continuous tracking of these vehicles' diagnostic information.

SUMMARY OF THE INVENTION

A diagnostic device has a compact design configured to fit into a tight space immediately around the OBD connector where it does not obstruct a vehicle rider or driver during vehicle operation. Further, the diagnostic device is configured to wirelessly connect to a smart phone or other smart device, to enable a user to track vehicle data in real time.

In one embodiment, a diagnostic device to diagnose a motorized device with an on-board diagnostic system includes a housing, an electrical connector, and a wireless transmission element. The electrical connector is supported by the housing and is configured to connect to an electrical connector of the on-board diagnostic system. The wireless transmission element is electrically connected to the electrical connector and is supported by the housing.

In another embodiment, a diagnostic device to diagnose a motorized device with an on-board diagnostic system includes a housing, electrically conductive connector components, and a wireless transmission element. The housing includes a first portion and an electrical connector portion, the electrical connector portion configured to connect to an electrical connector of the on-board diagnostic system. The electrically conductive connector components are supported by the electrical connector portion of the housing and are configured to electrically connect to the electrical connector of the on-board diagnostic system. The wireless transmission element is supported by the first portion of the housing.

In another embodiment, a diagnostic system to diagnose a motorized device with an on-board diagnostic system includes a connector configured to electrically connect to the on-board diagnostic system at a diagnostic port of the on-board diagnostic system, and a wireless transmission element electrically coupled with the connector. The wireless transmission element is configured to transmit diagnostic information to a computing device, and the computing device can be configured to wirelessly receive the diagnostic information from the wireless transmission element, and to translate the diagnostic information into a form readable by a human user.

DETAILED DESCRIPTION OF THE INVENTION

Figure 1:
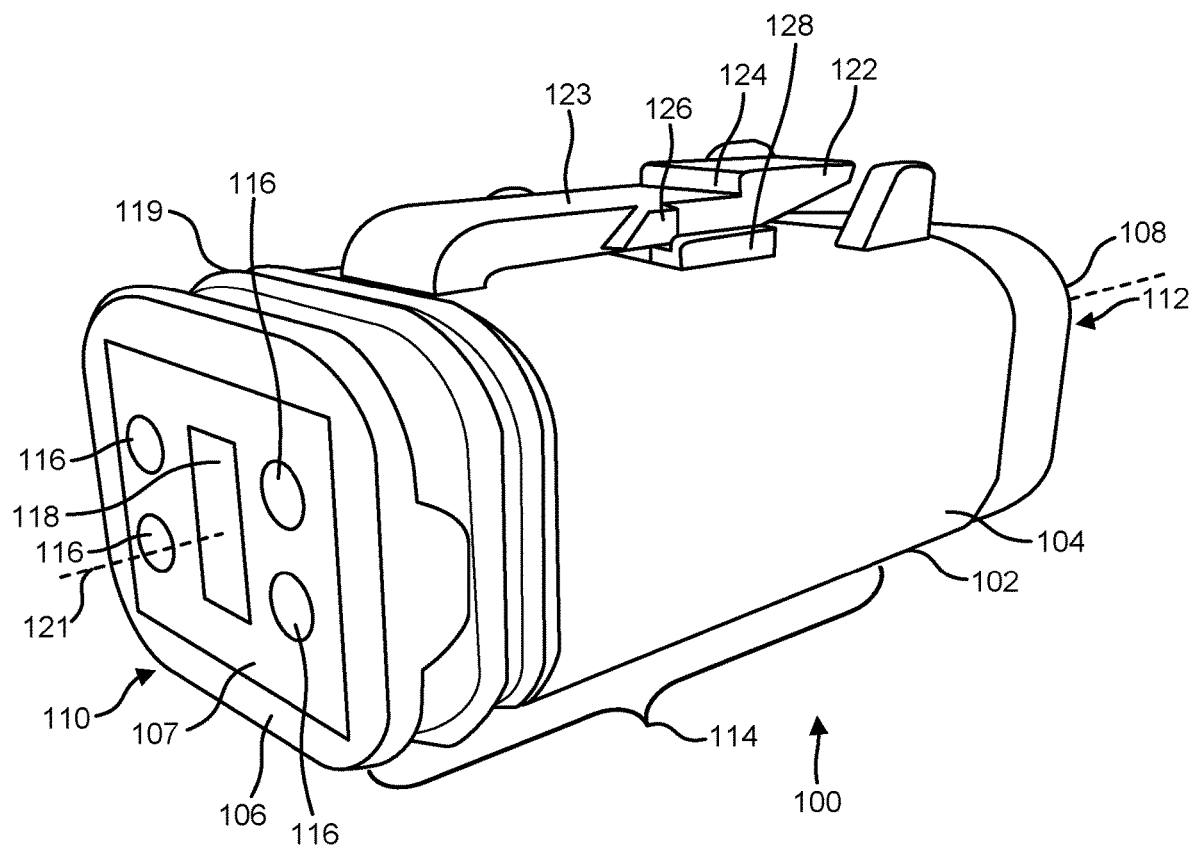
FIG. 1 is an isometric view illustrating a diagnostic device, according to an embodiment of the present invention.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

The terminology used herein is for the purpose of describing particular example embodiments only and is not intended to be limiting. As used herein, the singular forms "a", "an", and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terms "about" and "approximately", when used with a specific value, unless specified otherwise, shall mean any value within a range from the value given plus or minus 10 percent of the value given. For example, "approximately 10" can be any value from 9 to 11, and can also be limited to any range around 10 narrower than the range 9 to 11.

As discussed above, the presently disclosed diagnostic device provides a compact design configured to connect to an OBD connector and to fit into a tight space immediately around the OBD connector where the diagnostic device does not obstruct a vehicle rider or driver during operation of the vehicle. The diagnostic device can be used with motorcycles, scooters, all-terrain vehicles (ATVs), personal watercraft, boats, and any other vehicle equipped with an OBD system and a diagnostic port. Further, the present diagnostic device is configured to wirelessly connect to a smartphone or other computing device, to enable a user to track vehicle data in real time, through an easy to use application designed for the smartphone or other computing device.

FIG. 1 is an isometric view illustrating a diagnostic device 100 with a housing 102. The housing 102 can include a hollow shell 104, an electrical connector end cap 106, and a rear end cap 108. Electronic components can be mounted inside the hollow shell 104, inserted from a first end 110 or a second end 112 before installation of the electrical connector face 106 or the rear end face 108, respectively. The hollow shell 104 can include a connector portion 114 extending from the electrical connector face 106 a depth of the housing 102 toward the rear end cap 108 far enough to contain electrical connector components, including but not limited to pins, pin receptacles, and wires.

The rear end cap 108 can be integrally manufactured as part of the hollow shell 104, permanently affixed to the hollow shell 104, or removably fastened to the hollow shell. The latter option provides easier access to the electronic components during installation or maintenance. Any joint between the rear end cap 108 and the shell 104 can be fluidly sealed by any now-known or future-developed method to protect internal electronic components from exposure to water or other environmental hazards.

The electrical connector end cap 106 is configured to engage a connector (not shown) of an OBD system (not shown). OBD system connectors can vary, and so while the electrical connector end cap 106 is shown in a specific configuration, it should be noted that the electrical connector end cap 106 can be configured variously to mate with any now-known or future-developed OBD system connector. The number and shape of pin receptacles, and the shape of the electrical connector end cap 106, for example, can vary depending on the particular OBD system and OBD system connector to which the diagnostic device is intended to connect. In FIG. 1, the electrical connector end cap 106 has four pin receptacles 116 and a fastening stub 118, which extends from the center of the electrical connector end cap 16 into the shell 104 to press internal electrical components into place, and to removably lock the electrical connector end cap 106 on the shell 104. The joint between the electrical connector end cap 106 and the shell 104 can be fluidly sealed by any now-known or future-developed method to protect the internal electronic components from exposure to water or other environmental hazards. In the embodiment of FIG. 1, an elastically resilient gasket 119 can stretch to cover and/or seal the circumference of the joint between the shell 104 and the electrical connector end cap 106.

A retention element 120 can also be integrally manufactured with, or attached to, the housing 102, and can be considered part of the housing 102, or a separate component from the housing 102. The retention element 120 engages with a corresponding structure of an OBD system connector (not shown) to temporarily clip or lock the diagnostic device 100 in physical and electrical connection with the OBD system connector. In the embodiment of FIG. 1, the retention element 120 can have a release element 122 on an end of a spring lever 123. The release element 122 can be pressed toward the housing to release a catch element 124 on the lever 123 and enable a user to pull the diagnostic device 100 apart from the OBD system connector. The lever 123 can include guide elements 126, which in conjunction with guide elements 128 on the exterior of the shell 104, facilitate proper alignment of the lever 123 during operation of the lever 123. It should be noted that while a particular embodiment of the retention element 120 is depicted and described, the particular configuration of the retention element 120 can vary to mate with the particular OBD system connector.

The entire diagnostic device 100, excluding the retention element 120, can be contained within an envelope defined by the rigid housing 102. While the housing 102 can be shaped variously, the housing 102 in the embodiment of FIG. 1 forms the shape of a rectangular cuboid approximately 1.75 inches (approximately 44.45 mm) long by approximately 0.75 inches (approximately 19.05 mm) wide by approximately 0.5625 inches (approximately 14.2875 mm) high. The width and height can be driven by the width and height of the OBD system connector to which the diagnostic device is configured to connect such that the width and height are within the dimensions of the width and height of the OBD system connector to which the diagnostic device is configure to connect. Regardless of the shape of the housing 102, a shape of a cross-section of the housing 102 perpendicular to a longitudinal axis 121 of the housing fits inside a mating face of the electrical connector of the on-board diagnostic system. A front face 107 of the electrical connector end cap 106 is an example of the shape of a cross-section of the housing 102 perpendicular to the longitudinal axis 121 of the housing 102.

Figure 2:
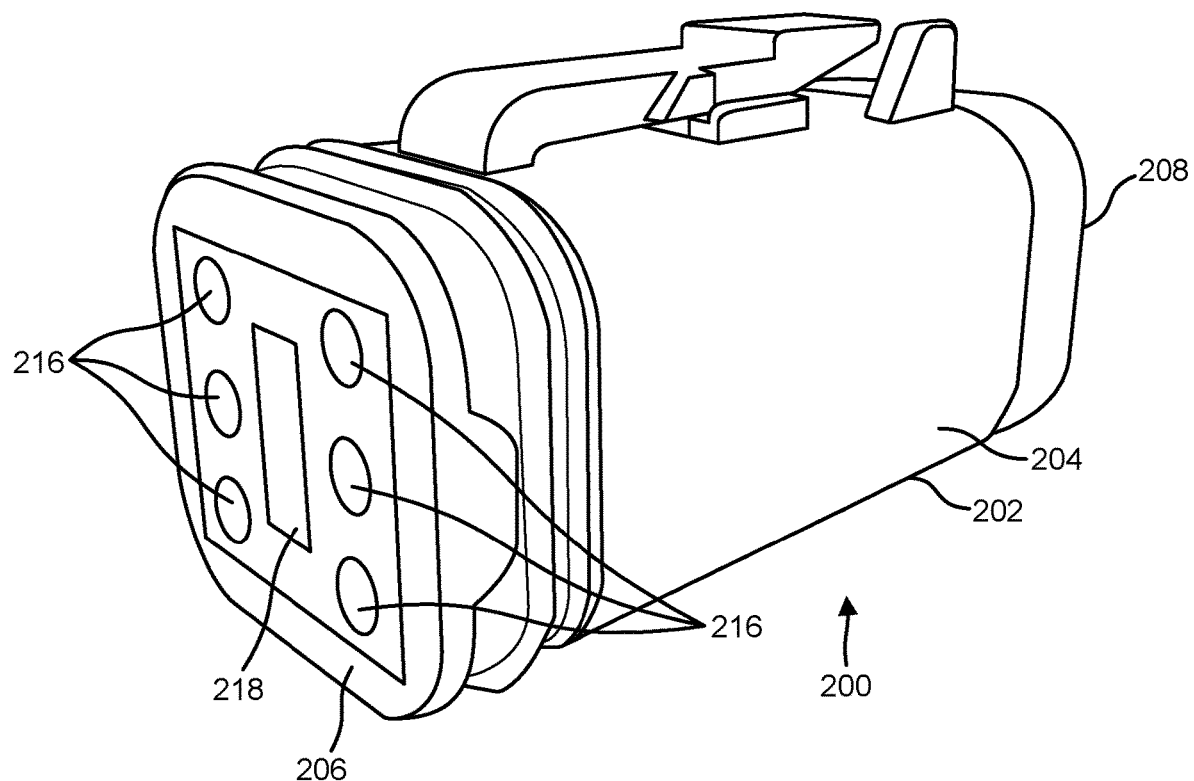
FIG. 2 is an isometric view illustrating a diagnostic device, according to another embodiment of the present invention.

FIG. 2 shows an embodiment of a diagnostic device 200 similar to that of the diagnostic device 100 but with a six-pin electrical connector end cap 206 having six pin receptacles 216. The size of a housing 202 differs from the housing 102 to accommodate the extra two pin receptacles 216, as driven by the six pin OBD system connector to which the diagnostic device 200 is configured to connect. The length and width of the diagnostic device 200 are the same as the length and width of the diagnostic device 100, but the height is larger, at approximately 0.75 inches (approximately 19.05 mm), to accommodate the extra row of pin receptacles 216.

Figure 3:
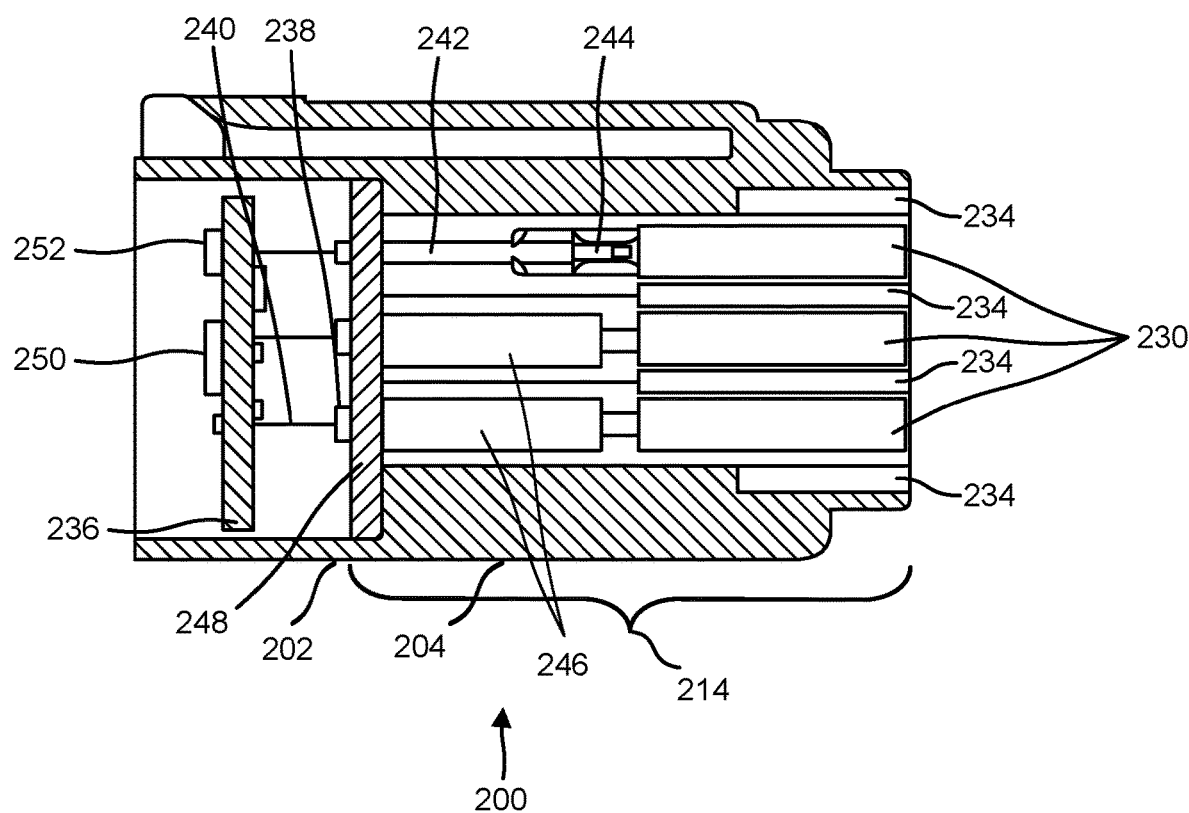
FIG. 3 shows a cross-sectional view of the diagnostic device of FIG. 2 with a pin location element removed.

FIG. 3 shows a cross-sectional view of the diagnostic device 200, revealing the internal electrical components, including but not limited to electrically conductive connector components. Referring to FIG. 2 and FIG. 3, the electrical connector end cap 206 and a rear end cap 208 are removed from the housing 202. Female electrical pins 230 can be individually contained in a connector portion 214 of the housing 202 between pin location walls 234, which can be integrated with, or attached to, a shell 204 of the housing 202. The female electrical pins 230 can receive male electrical pins of the OBD system connector. The female electrical pins 230 can be electrically connected to a printed circuit board (PCB) 236 either directly or with one or more interceding elements, such as the electrically conductive wires 238 illustrated. The wires 238 are shown with an exposed conductive portion 240 contacting the PCB 236, and an insulated portion 242 extending toward the female electrical pin 230, where a second conductive portion 244 is exposed and soldered to the female electrical pin 230. A wire and pin location element 246 extends from a support brace 248. The support brace 248 is a wall perpendicular to a center axis of the diagnostic device 200, with holes for the wires 238. The wire and pin location elements 246 help retain the wires 238 and pins 230 in position. One wire and pin location element 246 is removed to reveal the insulated portion 242 of one of the wires 238.

These internal electrical connector components can vary depending on the particular OBD system connector to which the diagnostic device 200 is configured to connect. For example, the number, shape, and configuration of pins 238 or other electrical contacts can vary depending on the corresponding attributes of the particular OBD system and OBD system connector to which the diagnostic device 200 is intended to connect. In some embodiments, such as the embodiments of FIG. 1 and FIG. 2, all electrical components (e.g., electrically conductive components) of the diagnostic devices 100, 200, can be contained within an internal space defined by the housing 102, 202.

The PCB 236 can contain a wireless transmission element 250 and a memory element 252. The wireless transmission element 250 can include a wireless transmitter, a modem, a SIM card, or another now-known or future-developed device capable of sending and/or receiving a signal wirelessly. The memory element 252 can be any now-known or future-developed device capable of storing information. The wireless transmission element 250 and the memory element 252 can be small enough to fit entirely inside the housing 202, and/or small enough to fit on the PCB 236. Combining the wireless transmission element 250 and the memory element 252 with a microcontroller can save space, though these elements can also be separate components. The PCB 236 can be smaller than approximately 0.5625 inches (approximately 14.2875 mm) by approximately 0.5625 inches (approximately 14.2875 mm) or less, while a PCB (not shown) in the diagnostic device 100 can be approximately 0.4063 inches (approximately 10.32 mm) by approximately 0.5625 inches (approximately 14.2875 mm), or less. In other embodiments configured to connect to larger OBD system connectors, the PCB can be larger.

The small size of the diagnostic device 100, 200 relative to the size of conventional diagnostic devices allows the diagnostic device 100, 200 to remain plugged in to the OBD system while the vehicle is operated, enabling vehicle riders or drivers to constantly monitor vehicle diagnostics during operation of the vehicle. Because of the compact size of the diagnostic device 100, 200, and because no components extend from or are directly connected to the housing 102, 202 besides the retention element 120, 220 and besides the diagnostic port when the diagnostic device 100, 200 is connected to the diagnostic port, the diagnostic device 100, 200 does not have any components dangling or obstructing normal, comfortable riding and operation of the vehicle. A majority of the diagnostic device 100, 200 fits into the connector of the OBD system, and no cables extend from the housing 102, 202, such that any panels or vehicle parts that must be removed or moved to access the connector of the OBD system can be replaced after connection of the diagnostic device 100, 200 to the connector of the OBD system.

Figure 4:
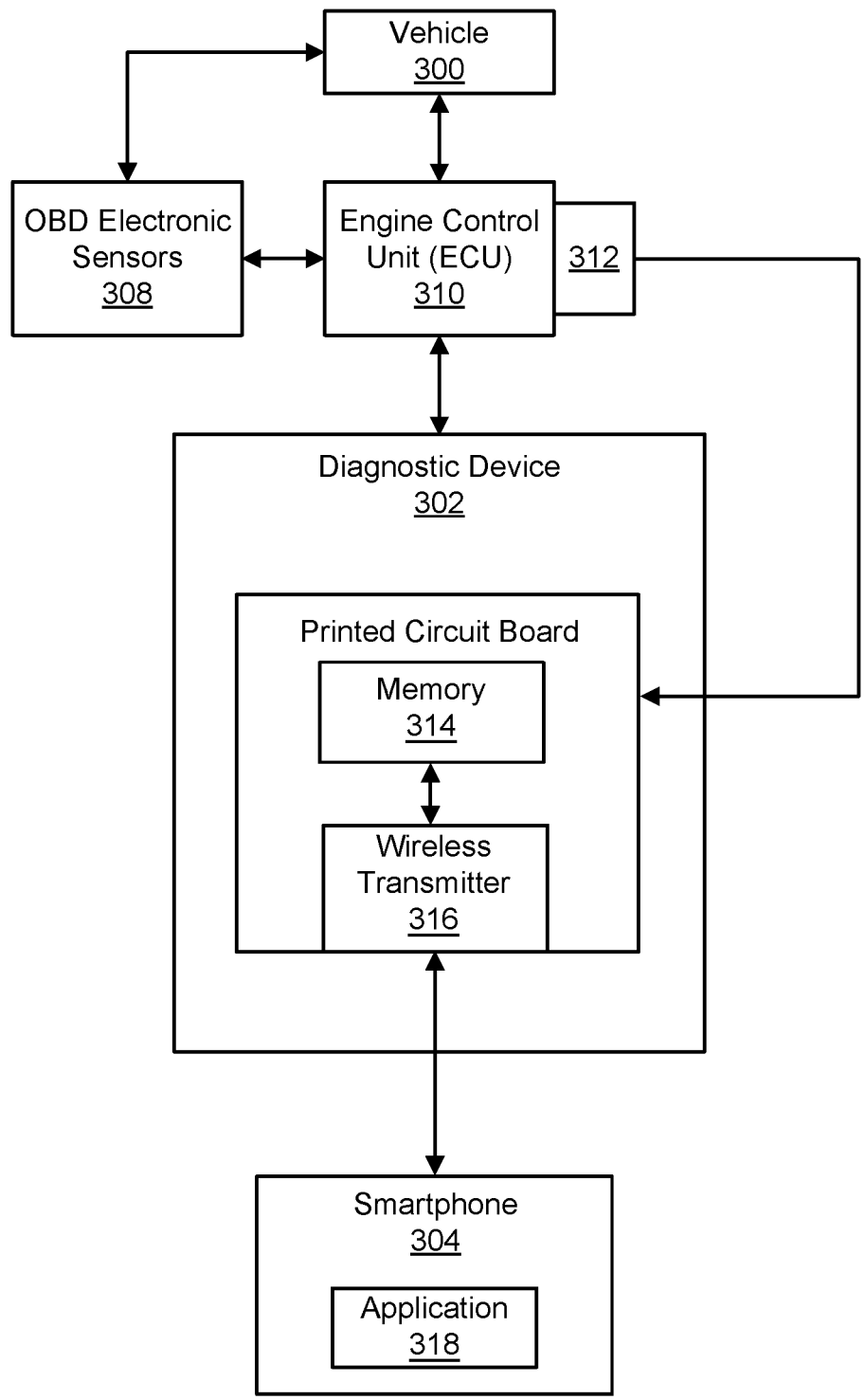
FIG. 4 is a flow chart showing connectivity between a vehicle 300, a diagnostic device 302, and a smartphone 304 in accordance with an embodiment of the present invention.

FIG. 4 is a flow chart showing connectivity between a vehicle 300, a diagnostic device 302, and a smartphone 304 in accordance with an embodiment of the present invention. The diagnostic device 302 can include the diagnostic device 100, the diagnostic device 200, or another embodiment of the diagnostic device disclosed herein. The smartphone can alternatively be another smart device or other computing device. An OBD system 306 of the vehicle 300 contains many electronic sensors 308 across different vehicle components. The OBD system 306 can be a proprietary system or system other than the conventional OBD system (i.e. OBD II in the USA, or E-OBD in Europe) used in cars and trucks. Vehicle components include, but are not limited to, fluid containers, engine, and transmission. When a specific problem occurs, the electronic sensors 308 are activated based in part on which component of the vehicle malfunctions. Diagnostic information such as sensor information can be relayed to an engine control unit 310. The engine control unit ("ECU") 310 can include or be wired to an OBD connection port 312. The OBD connection port 312 can connect to the diagnostic device 302. The ECU 310 can communicate back and forth with the diagnostic device 302, based on what command is given through a dedicated application on a smartphone or similar device (308). For example, an electronic sensor can detect that the front oxygen sensor is low. This diagnostic information can be relayed to the ECU 310, which in turn sends the diagnostic information to the diagnostic device 302.

The diagnostic device 302 can be configured to communicate under the proprietary or other communications protocol of the OBD system of the particular vehicle. The diagnostic device 302 can receive the diagnostic information from the ECU 310, can store the information in memory 314, and can send the diagnostic information, such as a specific corresponding error code from a wireless transmission element 316 to a dedicated application 318 on the user's smart phone 304 or similar smart device. The smart phone/device 304 can be connected to the diagnostic device 302 by a form of wireless transmission such as, but not limited to, Bluetooth, Wi-Fi, etc. The small size of the diagnostic device 302 can be facilitated, in part, by omitting in the diagnostic device 302 hardware and software necessary to process the diagnostic information, and by performing the processing instead using the smart phone/device 304. The information processing of the diagnostic device 302 can be limited to relaying of the diagnostic information to the smart phone/device 304. In addition to the benefit of a smaller diagnostic device 302, limiting the processing ability of the diagnostic device 302 reduced or eliminated the need to update firmware on the diagnostic device 302. Updating firmware of conventional diagnostic devices is a time-consuming procedure.

Figure 5:
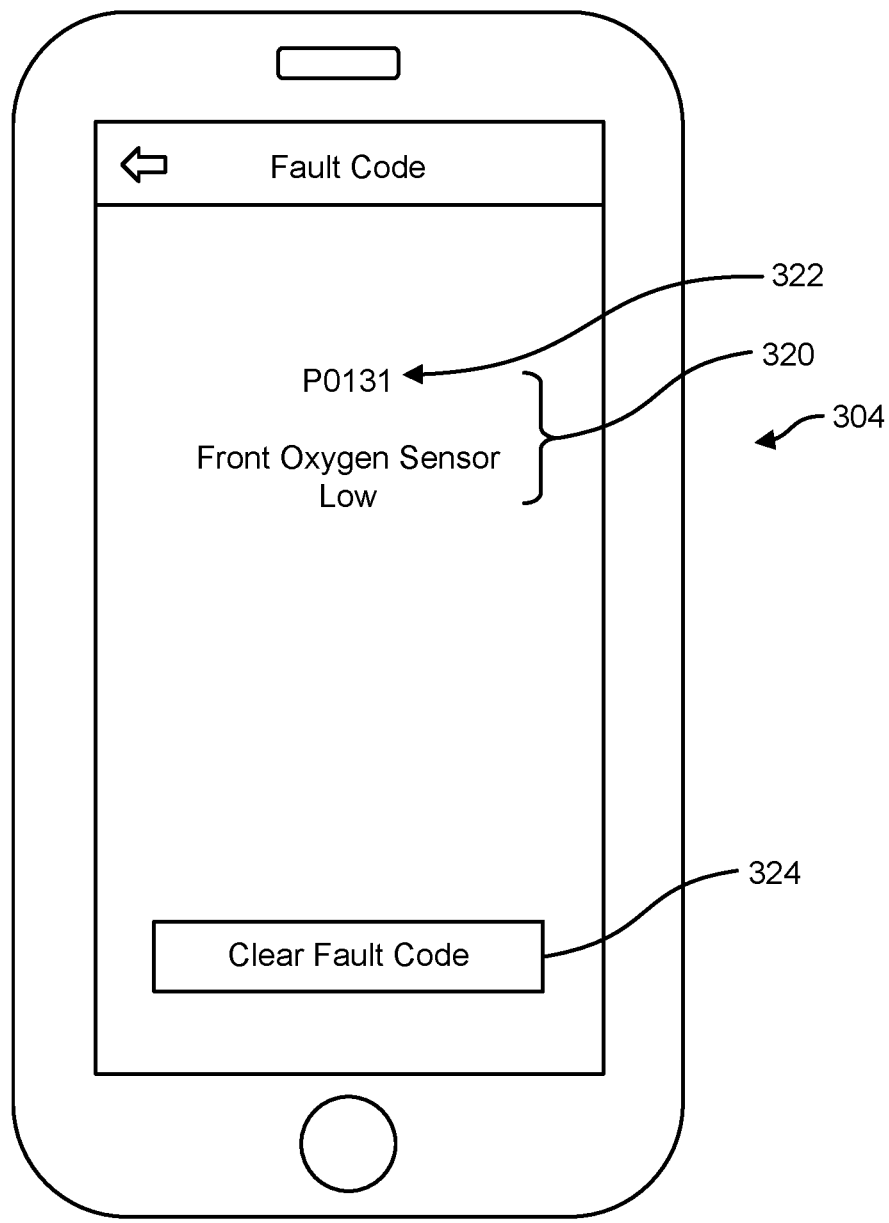
FIG. 5 shows an example of a smart phone displaying to a user an error notification, with an example error code that a front oxygen sensor is low, in accordance with embodiment of the present invention.

The application 318 can instead provide further processing functions, and the application 318 and smart phone/device 304 where the application resides, can be more easily updated than the diagnostic device 302. The application 318 can decode or translate the error code or other diagnostic information, such that the diagnostic information can be presented to a user in a readable form on the screen of the user's smart phone/device 304. FIG. 5 shows an example of the smart phone 304 displaying to a user an error notification 320, with an error code 322, that a front oxygen sensor is low. The user, having been notified of the problem, can hide the error notification 320, such as by selecting an option or tapping a button 324 offered by the application 318. In turn, the user's action can trigger the application 318 to communicate to the diagnostic device 302, which in turn can communicate back to the ECU 310, activating the ECU 310 to deactivate a check engine light on the vehicle 300.

The application 318 can be configured to receive, read, and process information other than error information from the diagnostic device 302, as well, to perform other diagnostic or non-diagnostic functions. Some examples of additional uses of the application 318 include generation, saving, and sharing of reports, viewing live data parameters, visualizing data parameters, as well as others. The software of the application 318 can be used to decode the information sent from the diagnostic device 302, avoiding the need for the diagnostic device to include this features in firmware, making software updates and bug fixes easier to implement and avoiding the need for complex and difficult-to-update firmware on the diagnostic device 302. Having less software/firmware on the diagnostic device 302 reduces the size of the motherboard or other hardware, facilitating the compact shape of the diagnostic device 302.

Figure 6:
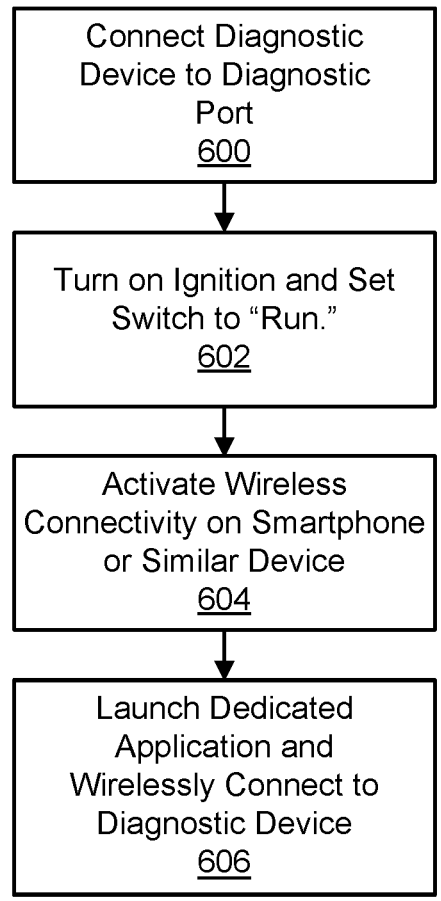
FIG. 6 is a flow chart listing steps to install and activate a diagnostic device in a vehicle, according to an embodiment of the invention.
Figure 7:
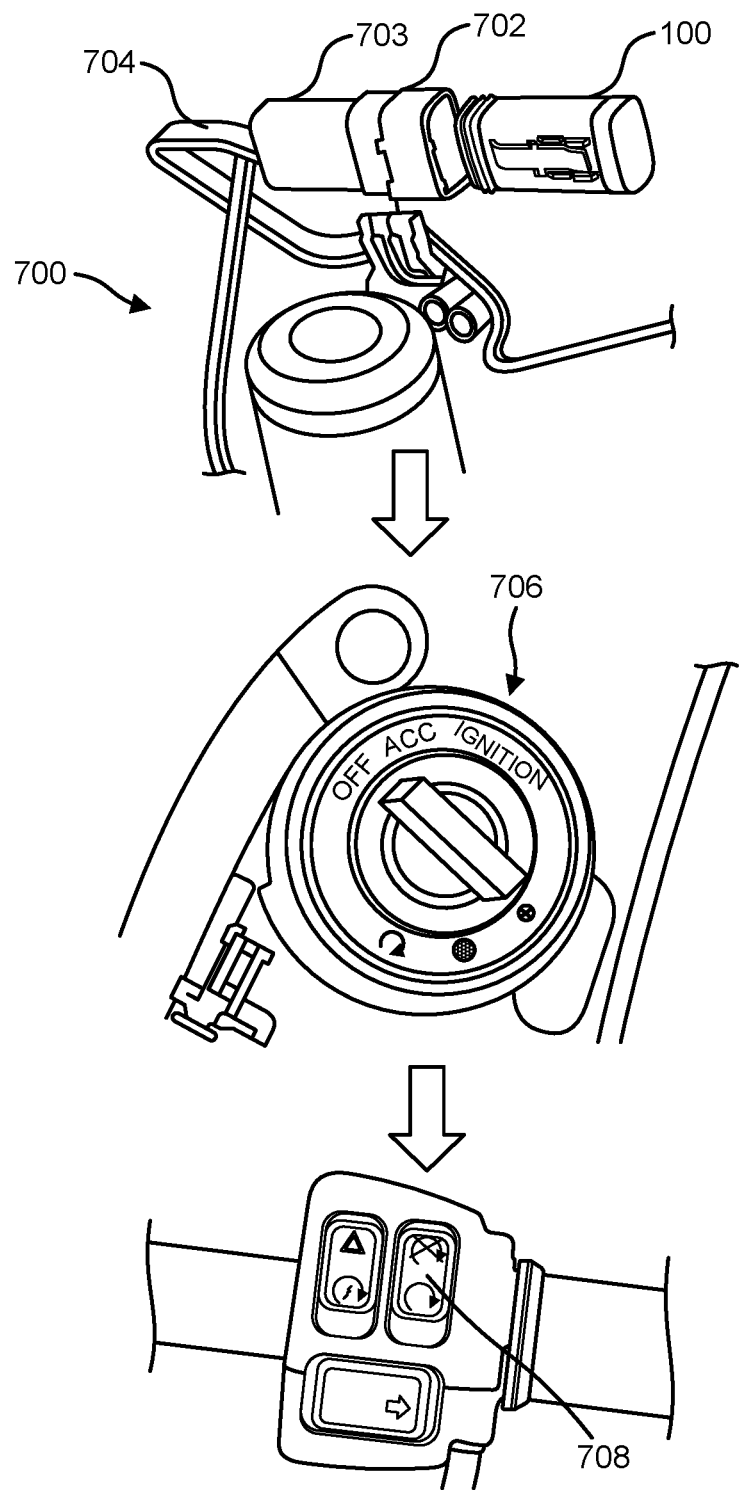
FIG. 7 is an illustrative representation showing the steps of FIG. 6.

FIG. 6 is a flow chart listing steps to install and activate a diagnostic device 100 in a vehicle 700, according to an embodiment of the invention. FIG. 7 is a corresponding illustrative representation showing the steps of FIG. 6. While the diagnostic device 100 is shown and described for illustrating purposes, any diagnostic device according to the present invention can be used. The vehicle in this example, though not shown in its entirety, and not intended to be limiting, is a motorcycle 700. According to step 600, a user can connect the diagnostic device 100 to a diagnostic port 702 of the motorcycle 700 by pushing the first end 110 of the diagnostic device 100 into the diagnostic port 702 until the retention element 120 of the diagnostic device clips or otherwise releasably fastens into place with the diagnostic port 702. The diagnostic port 702 can be an OBD system connector. The diagnostic port 702 shown is a standard type and size, and the compact size of the diagnostic device 100 is shown in comparison to the standard-sized diagnostic port 702. The user can tuck the diagnostic device 100 into the small space where the diagnostic port cable 704 is positioned.

After the user connects the diagnostic device 100 to the diagnostic port 702, according to step 602, the user can power the motorcycle 700 and the diagnostic device 100 by activating the ignition switch 706 and setting the run switch 708 to "run".

The diagnostic port 702 can transmit power to the diagnostic device 100, turning on and activating wireless transmission of the diagnostic device 100. After the motorcycle 700 is powered, according to step 604, the user can activate wireless transmission (e.g., Bluetooth) on his or her smart phone or similar smart device 304 (see FIG. 4). According to step 606, the user can launch or access the dedicated application 318 (see FIG. 4) to wirelessly connect the smart phone/device 304 with the diagnostic device 100. After the diagnostic device 100 is connected to the smart phone/device 304, using the application 318 the user can see the motorcycle data collected by the diagnostic device 100 from the motorcycle's OBD system. The data can be accessed in real-time, or saved as it is collected during vehicle operation, and viewed at a later time.

It is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A diagnostic device to diagnose motorcycles, scooters, ATVs, snowmobiles, personal watercraft, and other powersports vehicles with an on-board diagnostic system, the diagnostic device comprising:
   a housing;
   an electrical connector configured to connect to an electrical connector of the on-board diagnostic system, the electrical connector supported by the housing;
   a wireless transmission element electrically connected to the electrical connector and supported by the housing;
   wherein the housing forms the shape of a rectangular cuboid no larger in each dimension of length, width, and height than approximately 1.75 inches (approximately 44.45 mm) long, approximately 0.75 inches (approximately 19.05 mm) wide, and approximately 0.75 inches (approximately 19.05 mm) high;
   further comprising a printed circuit board enclosed within an internal space defined by the housing, the wireless transmission element mounted on the printed circuit board;
   wherein the printed circuit board is smaller than 0.5625 inches (approximately 14.2875 mm) wide by 0.5625 inches (approximately 14.2875 mm) long.

2. The diagnostic device of claim 1, wherein the electrical connecter and the wireless transmitter are entirely within a space defined by the housing.

3. The diagnostic device of claim 1 entirely within a space defined by the housing.

4. The diagnostic device of claim 1, further comprising a retention element to engage with a corresponding element of the on-board diagnostic system to removably retain the diagnostic device in connection with the on-board diagnostic system, the retention element mounted on an external portion of the housing, the entire diagnostic device being within a space defined by the housing and the retention element.

5. The diagnostic device of claim 1, wherein all electrical components of the diagnostic device are contained in a space defined by the housing.

6. The diagnostic device of claim 1, further comprising a memory in the housing.

7. The diagnostic device of claim 1, wherein a width and a height of the diagnostic device are within a width and a height of the electrical connector of the on-board diagnostic system to which the diagnostic device is configure to connect.

8. The diagnostic device of claim 1, wherein a shape of a cross-section of the housing perpendicular to a longitudinal axis of the housing fits inside a mating face of the electrical connector of the on-board diagnostic system to which the diagnostic device is configured to connect.

9. The diagnostic device of claim 1, further comprising a printed circuit board enclosed within an internal space defined by the housing, the wireless transmission element mounted on the printed circuit board.

10. A diagnostic device to diagnose motorcycles, scooters, ATVs, snowmobiles, personal watercraft, and other powersports vehicles with an on-board diagnostic system, the diagnostic device comprising:
    a housing including a first portion and an electrical connector portion, the electrical connector portion configured to connect to an electrical connector of the on-board diagnostic system;
    electrically conductive connector components configured to electrically connect to the electrical connector of the on-board diagnostic system, the electrically conductive connector components supported by the electrical connector portion of the housing; and
    a wireless transmission element supported by the first portion of the housing;
    wherein the housing forms the shape of a rectangular cuboid no larger in each dimension of length, width, and height than approximately 1.75 inches (approximately 44.45 mm) long, approximately 0.75 inches (approximately 19.05 mm) wide, and approximately 0.75 inches (approximately 19.05 mm) high.

11. The diagnostic device of claim 10, wherein the electrically conductive connecter components and the wireless transmission element are entirely within a space defined by the housing.

12. The diagnostic device of claim 10 entirely within a space defined by the housing.

13. The Diagnostic device of claim 10, further comprising a memory device in the housing.

14. The diagnostic device of claim 10, further comprising a width and a height, wherein the width and the height of the diagnostic device are within a width and a height of the electrical connector of the on-board diagnostic system to which the diagnostic device is configure to connect.

15. The diagnostic device of claim 10, wherein a shape of a cross-section of the housing perpendicular to a longitudinal axis of the housing fits inside a mating face of the electrical connector of the on-board diagnostic system to which the diagnostic device is configured to connect.

16. The diagnostic device of claim 10, further comprising a printed circuit board entirely within an internal space defined by the first portion of the housing, the wireless transmitter mounted on the printed circuit board.

17. A diagnostic system to diagnose motorcycles, scooters, ATVs, snowmobiles, personal watercraft, and other powersports vehicles with an on-board diagnostic system, the diagnostic device comprising:
    a connector configured to electrically connect to the on-board diagnostic system at a diagnostic port of the on-board diagnostic system;
    a housing
    wherein the housing forms the shape of a rectangular cuboid no larger in each dimension of length width, and height than approximately 1.75 inches (approximately 44.45 mm) long, approximately 0.75 inches (approximately 19.05 mm) wide, and approximately 0.75 inches (approximately 19.05 mm) high;
    a printed circuit board enclosed within an internal space defined by the housing, the wireless transmission element mounted on the printed circuit board;
    wherein the printed circuit board is smaller than 0.5625 inches (approximately 14,2875 mm) wide by 0.5625 inches (approximately 14.2875 mm) long; and
    a wireless transmission element electrically coupled with the connector, the wireless transmission element configured to transmit diagnostic information to a computing device,
    wherein the computing device can be configured to wirelessly receive the diagnostic information from the wireless transmission element, and to translate the diagnostic information into a form readable by a human user.

18. The diagnostic system of claim 17, wherein the diagnostic information includes an error code.

* * * * *